(12) United States Patent
Herring

(10) Patent No.: US 10,741,949 B2
(45) Date of Patent: Aug. 11, 2020

(54) CARD EDGE CONNECTOR ASSEMBLY WITH SUPPORT HARDWARE

(71) Applicant: TE CONNECTIVITY CORPORATION, Berwyn, PA (US)

(72) Inventor: Michael David Herring, Apex, NC (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/183,819

(22) Filed: Nov. 8, 2018

(65) Prior Publication Data

US 2019/0181574 A1  Jun. 13, 2019

Related U.S. Application Data

(60) Provisional application No. 62/597,744, filed on Dec. 12, 2017.

(51) Int. Cl.
| | |
|---|---|
| *H01R 12/71* | (2011.01) |
| *H01R 12/73* | (2011.01) |
| *H01R 12/72* | (2011.01) |
| *H05K 1/00* | (2006.01) |
| *H01R 33/97* | (2006.01) |

(Continued)

(52) U.S. Cl.
CPC ......... *H01R 12/737* (2013.01); *H01R 12/721* (2013.01); *H01R 33/97* (2013.01); *H05K 1/00* (2013.01); *H01R 12/52* (2013.01); *H01R 12/57* (2013.01); *H01R 12/62* (2013.01); *H01R 12/7005* (2013.01); *H01R 12/7023* (2013.01); *H01R 12/7029* (2013.01); *H01R 12/7047* (2013.01); *H01R 12/716* (2013.01); *H01R 12/79* (2013.01); *H01R 13/502* (2013.01); *H01R 13/518* (2013.01); *H01R 13/622* (2013.01); *H01R 13/6215* (2013.01);

(Continued)

(58) Field of Classification Search
CPC .............. H01R 12/721; H01R 12/7005; H01R 12/7029; H01R 12/716; H01R 13/639; H01R 13/6587; H01R 12/7047; H01R 13/502; H01R 13/518; H01R 13/6215; H01R 13/622
USPC .......... 439/637, 377, 327, 328, 64, 362, 374
See application file for complete search history.

(56) References Cited

U.S. PATENT DOCUMENTS

| | | | | |
|---|---|---|---|---|
| 5,181,855 A | * | 1/1993 | Mosquera | ............. H01R 13/28 439/74 |
| 6,030,251 A | * | 2/2000 | Stark | .................. H01R 12/7005 439/377 |

(Continued)

*Primary Examiner* — Abdullah A Riyami
*Assistant Examiner* — Justin M Kratt

(57) ABSTRACT

A card edge connector assembly includes a card edge connector and support hardware. The card edge connector includes a housing extending between a top and a bottom having a card slot at the top receiving a pluggable module in a mating direction. Contacts electrically connect to the pluggable module and the host circuit board. The support hardware has a top and a bottom and has first and second mounting blocks mounted to the host circuit board. The support hardware has a side rail extending between the first and second mounting blocks. A cavity that receives the card edge connector is defined on a first side by the side rail and on first and second ends by the first and second mounting blocks. The top of the support hardware is flush with or below the top of the card edge connector.

20 Claims, 12 Drawing Sheets

(51) Int. Cl.

| | |
|---|---|
| H01R 12/70 | (2011.01) |
| H01R 12/62 | (2011.01) |
| H01R 13/502 | (2006.01) |
| H01R 13/622 | (2006.01) |
| H01R 13/639 | (2006.01) |
| H01R 13/6587 | (2011.01) |
| H01R 13/64 | (2006.01) |
| H01R 12/52 | (2011.01) |
| H01R 12/57 | (2011.01) |
| H01R 13/621 | (2006.01) |
| H01R 12/79 | (2011.01) |
| H01R 13/518 | (2006.01) |

(52) U.S. Cl.
CPC ............ *H01R 13/639* (2013.01); *H01R 13/64* (2013.01); *H01R 13/6587* (2013.01)

(56) References Cited

U.S. PATENT DOCUMENTS

| | | | |
|---|---|---|---|
| 6,236,574 B1 * | 5/2001 | Han | H05K 9/0022 |
| | | | 361/816 |
| 6,945,810 B1 | 9/2005 | Morana et al. | |
| 7,326,092 B2 | 2/2008 | Fedder et al. | |
| 7,985,079 B1 * | 7/2011 | Wilson | H01R 12/52 |
| | | | 439/74 |
| 9,490,559 B2 * | 11/2016 | Takane | H01R 12/774 |
| 10,103,462 B1 | 10/2018 | Herring et al. | |
| 10,218,097 B2 | 2/2019 | Phillips et al. | |
| 10,224,652 B2 | 3/2019 | Herring et al. | |
| 2003/0199197 A1 * | 10/2003 | Yu | H01R 12/7047 |
| | | | 439/607.37 |
| 2011/0256753 A1 | 10/2011 | Gulla | |
| 2017/0187157 A1 * | 6/2017 | Hsu | H01R 12/7005 |
| 2019/0058270 A1 * | 2/2019 | Henry | H01R 12/737 |

* cited by examiner

CARD EDGE CONNECTOR ASSEMBLY WITH SUPPORT HARDWARE

CROSS REFERENCE TO RELATED APPLICATIONS

This application claims benefit to U.S. Provisional Application No. 62/597,744, filed Dec. 12, 2017, titled "CARD EDGE CONNECTOR ASSEMBLY", the subject matter of which is herein incorporated by reference in its entirety.

BACKGROUND OF THE INVENTION

The subject matter herein relates generally to card edge connector assemblies.

Card edge connectors are used in various system applications. For example, card edge connectors are typically mounted to a host circuit board. The card edge connectors include card slots for receiving a card edge, such as a circuit card of a pluggable module. However, know card edge connectors are not without disadvantages. For instance, the card edge connectors are typically designed for supporting the pluggable modules. The card edge connectors are subjected to stresses and strains during mating or when mated with the pluggable modules, which may damage or break the soldered connections between the contacts of the card edge connector and the host circuit board. Additionally, retention of the pluggable modules in the card edge connectors may present problems. For instance, latching systems are designed and occupy space around the card edge connectors for retaining the pluggable module in the card edge connector, limiting placement of other components on the host circuit board.

Some known card edge connectors include additional support hardware that is designed for interfacing with the particular pluggable module. However, it may be desirable to mate different types of pluggable modules with the card edge connector. The size, shape and placement of the support hardware are designed for one type of pluggable module and may restrict mating of a different type of pluggable module with the card edge connector. Additionally, some types of pluggable modules may require support hardware and other types of pluggable modules may be matable to the card edge connector without the need for support hardware. Adding support hardware in all instances may add unnecessary cost to the system, such as when a customer does not have the need for the support hardware. Moreover, the support hardware may require mounting hardware on the host circuit board for attachment of the support hardware to the host circuit board. Adding mounting hardware in all instances may add unnecessary cost to the system, such as when a customer does not have the need for the support hardware.

A need remains for a card edge connector assembly that may be mated with pluggable modules in a reliable manner.

BRIEF DESCRIPTION OF THE INVENTION

In one embodiment, a card edge connector assembly is provided including a card edge connector and support hardware. The card edge connector includes a housing extending between a top and a bottom configured to be mounted to a host circuit board. The card edge connector has a card slot at the top configured to receive a pluggable module in a mating direction. The housing holds contacts in the card slot to electrically connect to the pluggable module. The contacts are configured to be electrically connected to the host circuit board. The support hardware has a top and a bottom. The support hardware has a first mounting block at a first end and a second mounting block at a second end. The first and second mounting blocks are configured to be mounted to the host circuit board. The support hardware has a side rail extending between the first and second mounting blocks. The support hardware has a cavity defined on a first side by the side rail and on the first and second ends by the first and second mounting blocks. The cavity receives the card edge connector. The top of the support hardware is flush with or below the top of the card edge connector.

In another embodiment, a card edge connector assembly is provided including a card edge connector and support hardware. The card edge connector has a housing extending between a top and a bottom configured to be mounted to a host circuit board. The housing has a first end and a second end, and a first side and a second side extending between the first and second ends. The card edge connector has a card slot at the top configured to receive a pluggable module in a mating direction. The housing holds contacts in the card slot to electrically connect to the pluggable module configured to be electrically connected to the host circuit board. The support hardware has a top and a bottom and having a first mounting block at a first end and a second mounting block at a second end configured to be mounted to the host circuit board. The support hardware has a side rail extending between the first and second mounting blocks. The support hardware has a cavity defined on a first side by the side rail and on the first and second ends by the first and second mounting blocks that receives the card edge connector. The side rail has a step defining a pocket open to the cavity, a first support beam between the first mounting block and the step and a second support beam between the second mounting block and the step. The step has a third support beam. The first support beam has an interior surface abutting against the first side of the housing of the card edge connector and an exterior surface configured to engage a first supporting tab of the pluggable module to position the pluggable module relative to the support hardware. The second support beam has an interior surface abutting against the first side of the housing of the card edge connector and an exterior surface configured to engage a second supporting tab of the pluggable module to position the pluggable module relative to the support hardware. The third support beam has an interior surface facing the pocket and configured to engage a third supporting tab of the pluggable module to position the pluggable module relative to the support hardware.

In a further embodiment, a card edge connector assembly is provided including a pluggable module including a circuit card having a mating end including contact pads and including a housing holding the circuit card having a bottom and including a first supporting tab extending from the bottom, a second supporting tab extending from the bottom and a third supporting tab extending from the bottom. The card edge connector assembly includes a card edge connector receiving the pluggable module and having a housing extending between a top and a bottom configured to be mounted to a host circuit board. The housing has a first end and a second end and has a first side and a second side extending between the first and second ends. The card edge connector has a card slot at the top receiving the mating end of the pluggable module in a mating direction. The housing holds contacts in the card slot to electrically connect to corresponding contact pads of the pluggable module, the contacts being configured to be electrically connected to the host circuit board. The card edge connector assembly includes support hardware having a top and a bottom and having a first mounting block at a first end and a second mounting block at a second end configured to be mounted to the host circuit board. The support hardware has a side rail extending between the first and second mounting blocks. The support hardware has a cavity defined on a first side by the side rail and on the first and second ends by the first and second mounting blocks that receives the card edge connector. The side rail has a step defining a pocket open to the cavity, a first support beam between the first mounting block and the step and a second support beam between the second mounting block and the step. The step has a third support beam. The first support beam has an interior surface abutting against the first side of the housing of the card edge connector and an exterior surface configured to engage a first supporting tab of the pluggable module to position the pluggable module relative to the support hardware. The second support beam has an interior surface abutting against the first side of the housing of the card edge connector and an exterior surface configured to engage a second supporting tab of the pluggable module to position the pluggable module relative to the support hardware. The third support beam has an interior surface facing the pocket and configured to engage a third supporting tab of the pluggable module to position the pluggable module relative to the support hardware.

DETAILED DESCRIPTION OF THE INVENTION

Figure 1:
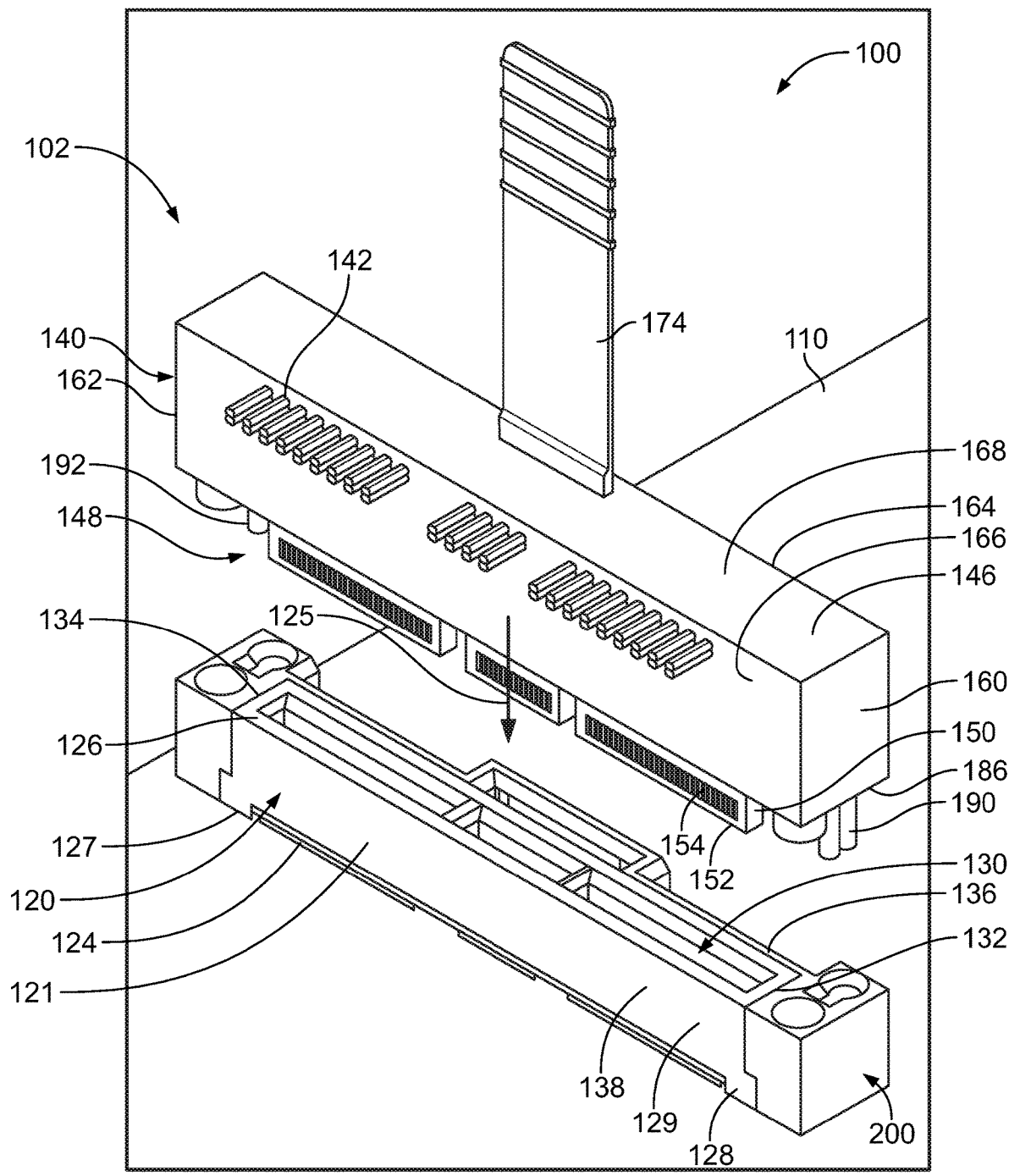
FIG. 1 is a rear perspective view of an electrical system having a card edge connector assembly in accordance with an exemplary embodiment including a card edge connector and support hardware in accordance with an exemplary embodiment.
Figure 2:
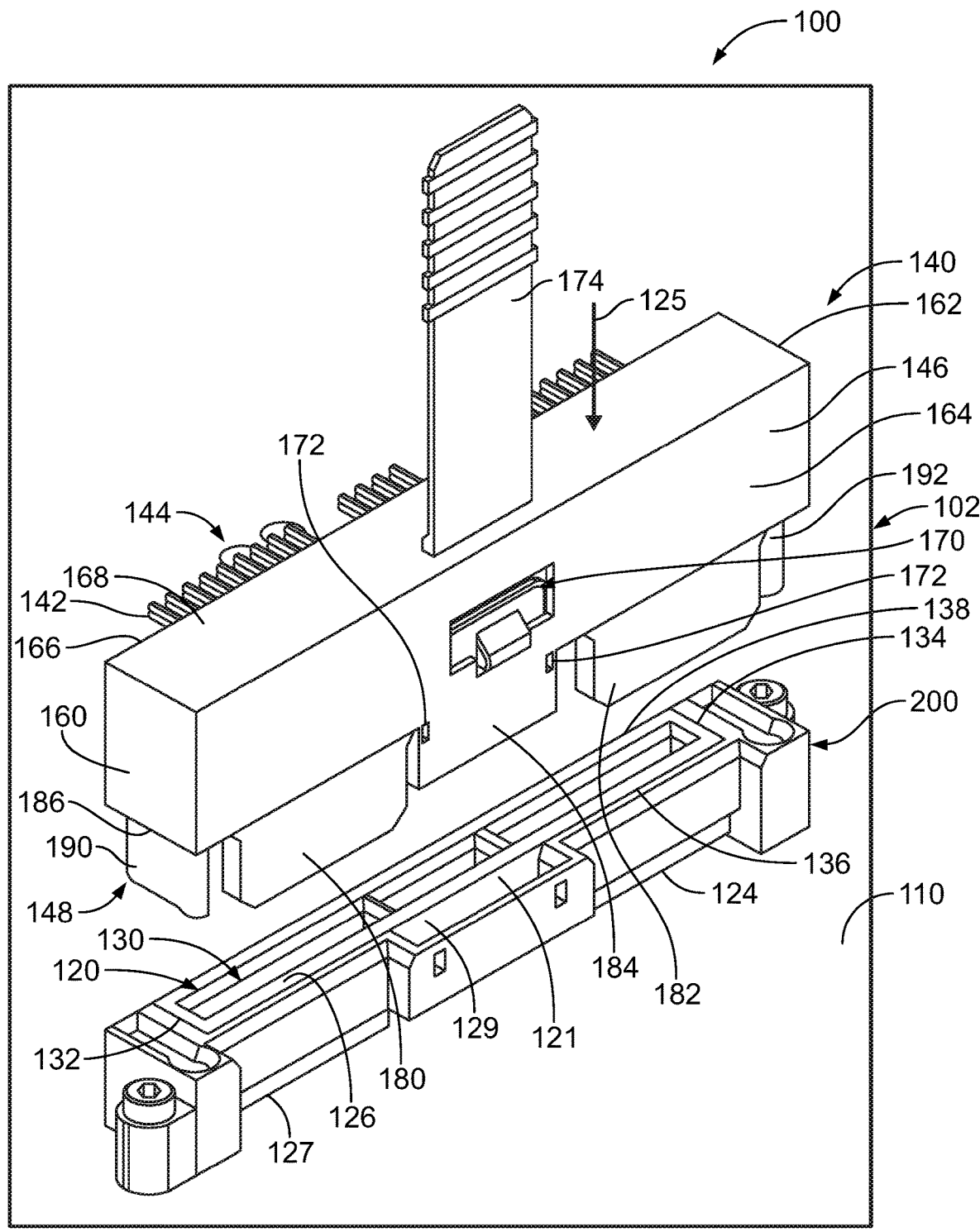
FIG. 2 is a front perspective view of the electrical system having the card edge connector assembly in accordance with an exemplary embodiment.

FIG. 1 is a rear perspective view of an electrical system 100 having a card edge connector assembly 102 in accordance with an exemplary embodiment. FIG. 2 is a front perspective view of the electrical system 100 having the card edge connector assembly 102 in accordance with an exemplary embodiment. The card edge connector assembly 102 is mounted to a host circuit board 110. In the illustrated embodiment, the card edge connector assembly 102 is a vertical card edge connector assembly where the components are oriented and mated generally vertically or perpendicular to the host circuit board 110. However, in other various embodiments, the electrical system 100 may have components in different orientations, such as at a right angle orientation. Other types of card edge connector assemblies may be utilized in alternative embodiments.

The card edge connector assembly 102 includes a card edge connector 120 and support hardware 200 mounted over the card edge connector 120. The support hardware 200 is used to support the card edge connector 120, such as to support components mated to the card edge connector 120. The card edge connector 120 is configured to be mounted to the host circuit board 110, such as by soldering contacts 124 of the card edge connector 120 to the host circuit board 110; however, the contacts 124 may be attached by other processes such as press fit contacts, spring beam contacts, and the like. The card edge connector 120 has a mating end for mating with a mating component, such as a pluggable module 140. In the illustrated embodiment, the pluggable module 140 is a cable assembly; however, other types of pluggable modules may be used in alternative embodiments, such as a paddle card, an add-in card, a riser card, and the like. The pluggable module 140 may include a circuit card having a card edge configured to be plugged into the card end connector 120. In the illustrated embodiment, the mating end is provided at a top 126 of the card edge connector 120 to receive the pluggable module 140 in a generally vertical mating direction 125, such as a mating direction perpendicular to the host circuit board 110.

The card edge connector 120 includes a housing 121 extending between the top 126 and a bottom 127. The housing 121 includes a base 128 at the bottom 127 that is configured to be mounted to the host circuit board 110. The contacts 124 extend to the bottom 127 for termination to the host circuit board 110. The housing 121 has a perimeter 129 surrounding a card slot 130 configured to receive the pluggable module 140. The card slot 130 is open at the top 126 to receive the pluggable module 140. The card slot 130 may be chamfered at the top 126 to guide the pluggable module 140 into the card slot 130. The contacts 124 are exposed in the card slot 130 for electrical connection with the pluggable module 140. The perimeter 129 is defined by a first end 132, an opposite second end 134, a first side 136 and an opposite second side 138.

The pluggable module 140 is configured to be mated with the card edge connector 120 and the support hardware 200. In the illustrated embodiment, the pluggable module 140 includes cables 142 extending from a cable end 144 of the pluggable module 140; however, other types of pluggable modules may be utilized in alternative embodiments, such as non-cabled pluggable modules. The pluggable module 140 includes a housing 146 holding a circuit card 150 at a mating end 148 of the pluggable module 140. The circuit card 150 may extend below the housing 146 a distance for loading into the card edge connector 120. The cables 142 may be terminated to the circuit card 150, such as by soldering to the circuit card 150. Optionally, the housing 146 may be overmolded over the circuit card 150 and the cables 142.

The circuit card 150 has a card edge 152 at the mating end 148 configured to be loaded into the card edge connector 120. The pluggable module 140 has a plurality of contact pads 154 at the card edge 152 configured to be electrically connected to the card edge connector 120. Optionally, the pluggable module 140 may include one or more electrical components (not shown) on the circuit card 150, such as a memory, a processor, or other types of electrical components. The electrical components are electrically connected to corresponding contact pads 154. The pluggable module 140 includes various circuits transmitting data and/or power between the contact pads 154, the electrical components, and the cables 142. The pluggable module 140 may include one or more heat sinks for dissipating heat from the pluggable module 140.

The pluggable module 140 extends between a first end 160 and a second end 162. The sides 164, 166 are wider than the ends 160, 162. The pluggable module 140 has a first side 164 and a second side 166 between the first and second ends 160, 162. Optionally, the cables 142 extend from the second side 166; however, the cables 142 may extend from other portions in alternative embodiments, such as the first side 164, a top 168 or elsewhere. The pluggable module 140 includes a latch 170 at the first side 164 for securing the pluggable module 140 in the card edge connector assembly 102. In the illustrated embodiment, the latch 170 includes latching fingers 172 configured to be latchably secured to the support hardware 200 and/or the card edge connector 120. The latch 170 includes an actuator 174 for actuating the latching fingers 172. In the illustrated embodiment, the actuator 174 is a pull tab; however, other types of actuators may be used in alternative embodiments, such as a push button, a release spring, and the like.

In an exemplary embodiment, the pluggable module 140 includes one or more supporting tabs for supporting the pluggable module 140 on the support hardware 200. For example, in the illustrated embodiment, the pluggable module 140 includes a pair of outer supporting tabs 180, 182 and a recessed supporting tab 184. The supporting tabs 180, 182, 184 extend downward from a bottom 186 of the housing 146. The recessed supporting tab 184 is recessed rearward of the first and second outer supporting tabs 180, 182. The outer supporting tabs 180, 182 are forward of the recessed supporting tab 184, such as coplanar with the first side 164 of the pluggable module 140. Having the supporting tabs 180, 182, 184 staggered at different lateral positions between the first side 164 and the second side 166 allows positioning of the supporting tabs 180, 182, 184 at different depths of the support hardware 200, such as for engaging different parts of the support hardware 200. The supporting tabs 180, 182, 184 provide rigidity between the pluggable module 140 and the support hardware 200 to alleviate stress on the card edge connector 120. The supporting tabs 180, 182, 184 support the pluggable module 140 on the support hardware 200. The supporting tabs 180, 182, 184 may be used for positioning or locating the pluggable module 140 relative to the support hardware 200 and/or the card edge connector 120. For example, the supporting tabs 180, 182, 184 may be used for side-to-side positioning and/or end-to-end positioning. The supporting tabs 180, 182, 184 may be used to guide mating of the pluggable module 140 with the support hardware 200 and/or the card edge connector 120.

In an exemplary embodiment, the pluggable module 140 includes guide tabs 190, 192 extending from the bottom 186 of the housing 146 to guide mating with the support hardware 200. The guide tabs 190, 192 may be provided proximate to the first and second ends 160, 162. The guide tabs 190, 192 may flank opposite ends of the circuit card 150. The guide tabs 190, 192 may be sized and shaped to guide mating with the support hardware 200. Optionally, the guide tabs 190, 192 may be asymmetric to provide keyed mating with the support hardware 200. For example, the guide tabs 190, 192 may allow mating in one orientation and may restrict mating in an opposite, 180° orientation. For example, one side of the guide tabs 190, 192 may be enlarged or wider while the opposite side of the guide tabs 190, 192 may be narrower and/or have a different shape.

Figure 3:
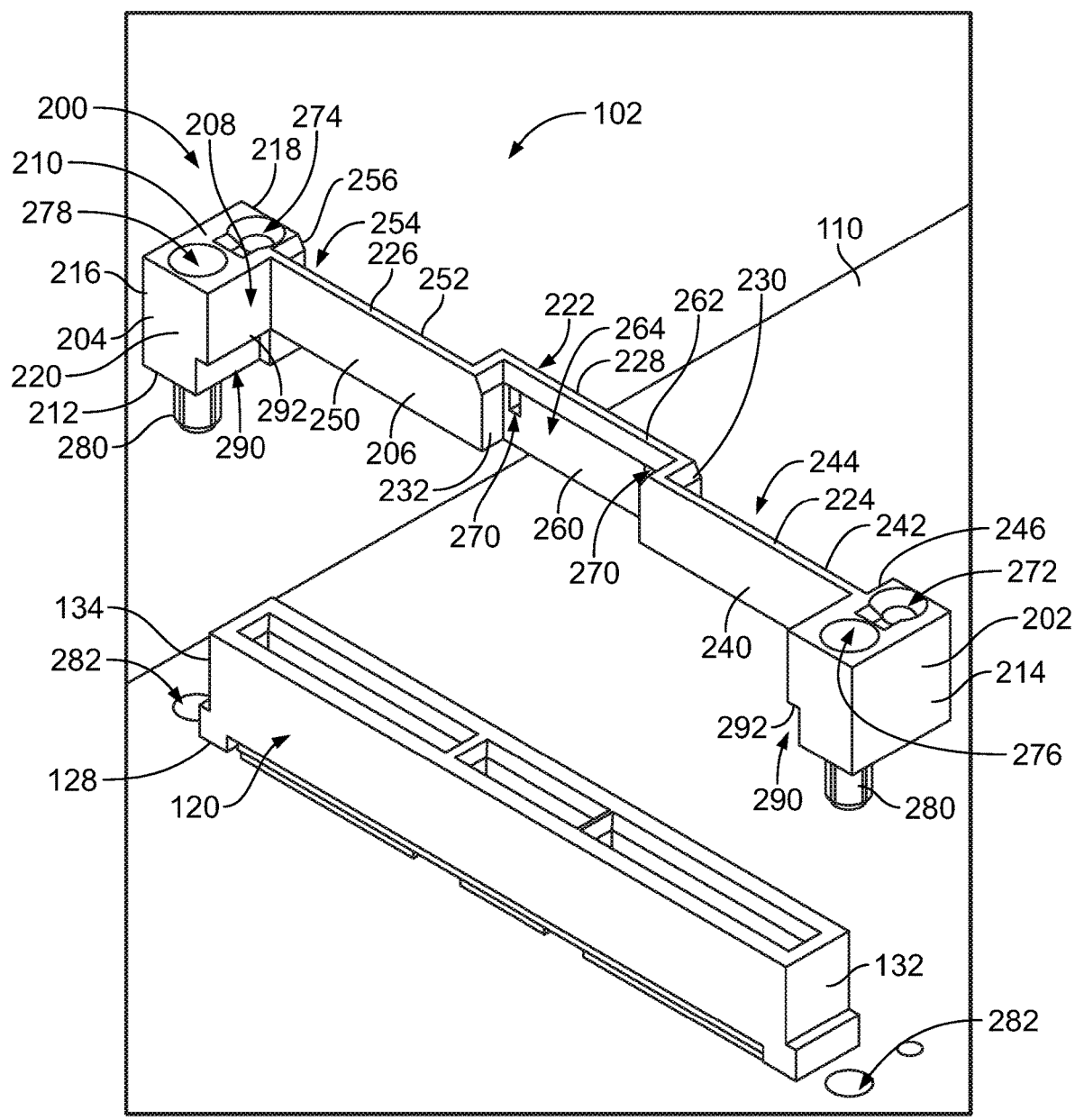
FIG. 3 is an exploded view of a portion of the card edge connector assembly showing the support hardware.
Figure 4:
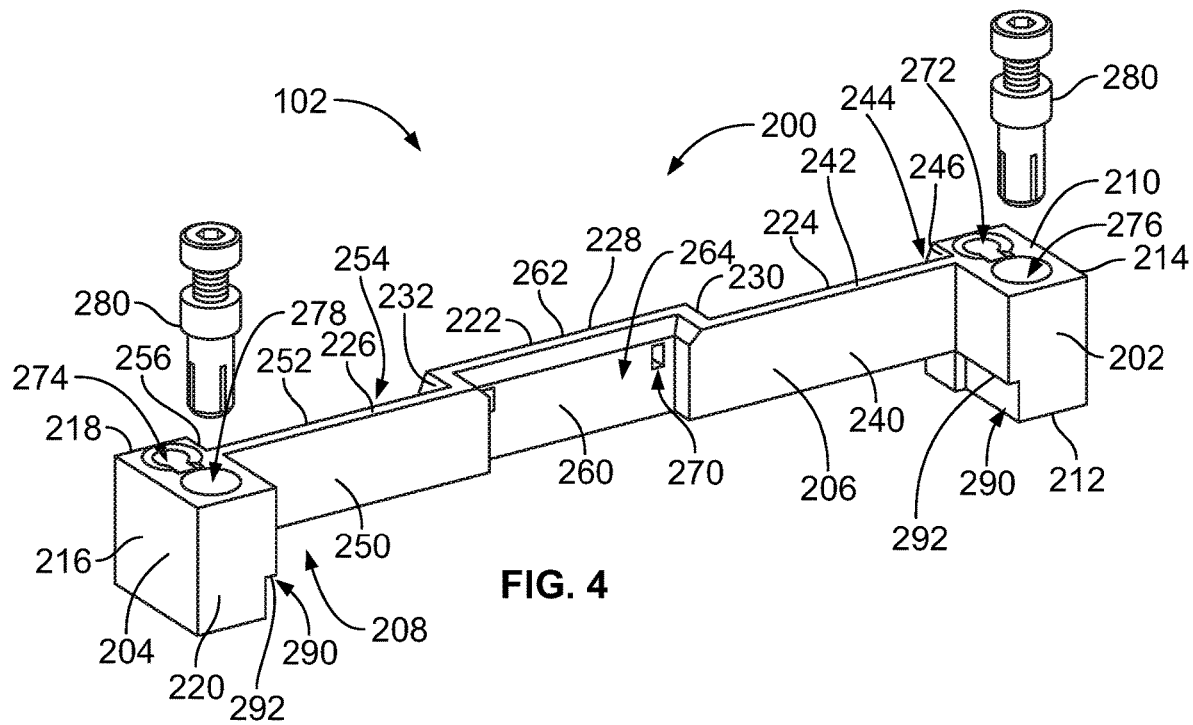
FIG. 4 is a rear perspective view of the support hardware in accordance with an exemplary embodiment.

FIG. 3 is an exploded view of a portion of the card edge connector assembly 102 showing the support hardware 200 poised for coupling to the host circuit board 110 over the card edge connector 120. FIG. 4 is a rear perspective view of the support hardware 200 in accordance with an exemplary embodiment. The support hardware 200 may be coupled to the host circuit board 110 (FIG. 3) after the card edge connector 120 (FIG. 3) is installed on the host circuit board 110. For example, the support hardware 200 may be field installable to the host circuit board 110 while the card edge connector 120 may be installed in a manufacturer's facility. For example, the support hardware 200 may be an optional component installed by a customer rather than be installed at a circuit board manufacturer's facility. The host circuit board 110 may include openings to receive the support hardware 200, but it may be at the discretion of the customer to install the support hardware 200. As such, the support hardware 200 may be installed in various applications, such as when additional support for the card edge connector 120 is desired. For example, in systems utilizing pluggable modules, such as paddle cards, the support hardware 200 may not be needed. However, in applications utilizing pluggable modules, such as cable assemblies, the support hardware 200 may be desired to alleviate stress on the card edge connector 120. However, in other various embodiments, the support hardware 200 may be installed at the same time as the card edge connector 120 or prior to installation of the card edge connector 120.

In various embodiments, the support hardware 200 includes a base mounted to the host circuit board 110 independent of the card edge connector 120 such that the support hardware 200 is self-supporting or otherwise not supported by the card edge connector 120. In an exemplary embodiment, the support hardware 200 includes support members for supporting the support hardware 200 and the pluggable module 140, such as first and second mounting blocks 202, 204 at opposite ends of the card edge connector 120. The support hardware 200 alleviates stress or strain on the card edge connector 120 from the pluggable module 140, such as from movement of the pluggable module 140. The mounting blocks 202, 204 transfer stresses or strains from the pluggable module 140 into the base, and thus into the host circuit board 110, separate from the card edge connector 120, to alleviate stress or strain on the card edge connector 120. The support hardware 200 may guide mating of the pluggable module 140 with the card edge connector 120.

In an exemplary embodiment, the support hardware 200 includes a side rail 206 between the mounting blocks 202, 204. The side rail 206 extends along one side of the card edge connector 120 such that the side rail 206 and the mounting blocks 202, 204 at least partially surround the card edge connector 120. In various embodiments, the support hardware 200 may include a second side rail (not shown) extending along the opposite second side of the card edge connector 120 to entirely surround the card edge connector 120 rather than only partially surrounding the card edge connector 120. In the illustrated embodiment, the side rail 206 connects the mounting blocks 202, 204 such that the support hardware 200 is a single, unitary structure. The support hardware 200 includes a cavity 208 that receives the pluggable module 140. The cavity 208 is defined on the opposite ends by the mounting blocks 202, 204 and defined on one side by the side rail 206.

The support hardware 200 includes a top 210 and the bottom 212. The support hardware 200 extends between a first end 214 and a second end 216. The mounting blocks 202, 204 are provided at the first end 214 and the second end 216, respectively. The side rail 206 is provided at a first side 218 of the support hardware 200. The cavity 208 is open at a second side 220 of the support hardware 200; however, in other various embodiments, the second side 220 may be closed by a second side rail (not shown). Optionally, the side rail 206 may be provided at or near the top 210. The side rail 206 may extend at least partially between the top 210 and the bottom 212. In various embodiments, the side rail 206 is elevated above the bottom 212. However, in alternative embodiments, the side rail 206 may extend to the bottom 212 such that the side rail 206 engages the host circuit board 110.

In an exemplary embodiment, the side rail 206 includes a step 222, such as approximately centered between the mounting blocks 202, 204. The side rail 206 may include multiple steps in alternative embodiments. In the illustrated embodiment, the step 222 extends forward. The side rail 206 includes a first support beam 224 between the first mounting block 202 and the step 222 and a second support beam 226 between the second mounting block 204 and the step 222. The step 222 includes a third support beam 228 between a first flange 230 and a second flange 232. The first flange 230 extends between the third support beam 228 and the first support beam 224. The second flange 232 extends between the third support beam 228 and the second support beam 226. The flanges 230, 232 may extend perpendicular to the support beams 224, 226, 228; however, the flanges 230, 232 may be angled nonparallel to kill in alternative embodiments.

The first support beam 224 includes an interior surface 240 and an exterior surface 242. The interior surface 240 faces the cavity 208. The exterior surface 242 faces the exterior of the support hardware 200. In an exemplary embodiment, the first support beam 224 includes a first pocket 244. The first pocket 244 is defined by the exterior surface 242, the first flange 230 and a side surface 246 of the first mounting block 202. The first pocket 244 is configured to receive a portion of the pluggable module 140 (shown in FIG. 2), such as one of the supporting tabs of the pluggable module 140.

The second support beam 226 includes an interior surface 250 and an exterior surface 252. The interior surface 250 faces the cavity 208. The exterior surface 252 faces the exterior of the support hardware 200. In an exemplary embodiment, the second support beam 226 includes a second pocket 254. The second pocket 254 is defined by the exterior surface 252, the second flange 232 and a side surface 256 of the second mounting block 204. The second pocket 254 is configured to receive a portion of the pluggable module 140 (shown in FIG. 2), such as one of the supporting tabs of the pluggable module 140.

The third support beam 228 includes an interior surface 260 and an exterior surface 262. The interior surface 260 faces the cavity 208. The exterior surface 262 faces the exterior of the support hardware 200. In an exemplary embodiment, the third support beam 228 includes a third pocket 264. The third pocket 264 is defined by the interior surface 260, the first flange 230 and the second flange 232. The third pocket 264 is configured to receive a portion of the pluggable module 140 (shown in FIG. 2), such as one of the supporting tabs of the pluggable module 140.

In an exemplary embodiment, the support hardware 200 includes a latching feature 270 for latchably securing the pluggable module 140 in the support hardware 200 and the card edge connector 120. In the illustrated embodiment, the latching feature 270 includes latching openings in the side rail 206, such as in the third support beam 228 that receive the latch 170 (shown in FIG. 2) of the pluggable module 140 to secure the pluggable module 140 in the support hardware 200 and the card edge connector 120. The latch 170 is releasably coupled to the latching features 270. The latch 170 is configured to be unlatched to release the pluggable module 140 from the card edge connector 120 and the support hardware 200. For example, the actuator 174 (shown in FIG. 2) attached to the latch 170 may be actuated to unlatch the latch 170. \

The first mounting block 202 includes a guide feature 272 to guide mating with the pluggable module 140. In the illustrated embodiment, the guide feature 272 is a guide opening configured to receive the guide tab 190 (shown in FIG. 2) of the pluggable module 140. The guide feature 272 is sized and shaped to interface with the guide tab 190. In the illustrated embodiment, the guide feature 272 is open at the top 210 of the support hardware 200 to receive the guide tab 190. Other types of guide features may be utilized in alternative embodiments, such as surfaces, edges, guideposts, or other types of features. The guide feature 272 may be sized and/or shaped to provide keyed mating with the pluggable module 140. For example, the guide feature 272 may receive the guide tab 190 in only one orientation of the pluggable module 140 to key mating of the pluggable module 140 with the support hardware 200.

The second mounting block 204 includes a guide feature 274 to guide mating with the pluggable module 140. In the illustrated embodiment, the guide feature 274 is a guide opening configured to receive the guide tab 192 (shown in FIG. 2) of the pluggable module 140. The guide feature 274 is sized and shaped to interface with the guide tab 192. In the illustrated embodiment, the guide feature 274 is open at the top 210 of the support hardware 200 to receive the guide tab 192. Other types of guide features may be utilized in alternative embodiments, such as surfaces, edges, guideposts, or other types of features. The guide feature 274 may be sized and/or shaped to provide keyed mating with the pluggable module 140. For example, the guide feature 274 may receive the guide tab 192 in only one orientation of the pluggable module 140 to key mating of the pluggable module 140 with the support hardware 200.

Figure 5:
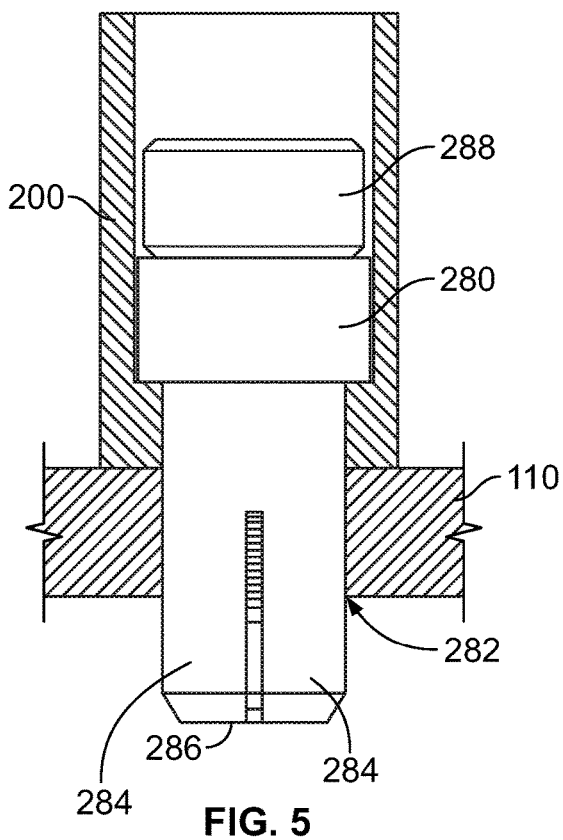
FIG. 5 illustrates a portion of the support hardware in accordance with an exemplary embodiment.

In an exemplary embodiment, the support hardware 200 includes anchor openings 276, 278 in the first and second mounting blocks 202, 204 that receive anchors 280 for securing the support hardware 200 to the host circuit board 110. The host circuit board 110 includes openings 282 that receive the anchors 280. The anchors 280 are illustrated in FIG. 5 in accordance with an exemplary embodiment. Optionally, the anchors 280 may be spreading type anchors wherein spreading arms 284 at ends 286 of the anchors 280 are spread apart when drivers 288 of the anchors 280 are actuated to tighten and secure the anchor 280 to the host circuit board 110 or to mounting hardware of the host circuit board 110. Other types of anchors 280 may be used in alternative embodiments, such as threaded anchors, quarter turn anchors, clips, press-fit connectors, solder tabs, or other types of fasteners.

Returning to FIGS. 3 and 4, in an exemplary embodiment, the support hardware 200 includes notches 290 in the first and second mounting blocks 202, 204. The notches 290 are defined by shoulders 292. The notches 290 receive the base 128 of the card edge connector 120 at the first and second ends 132, 134. The shoulders 292 may press downward against the base 128 at the first and second ends 132, 134 to hold the card edge connector 120 on the host circuit board 110.

Figure 6:
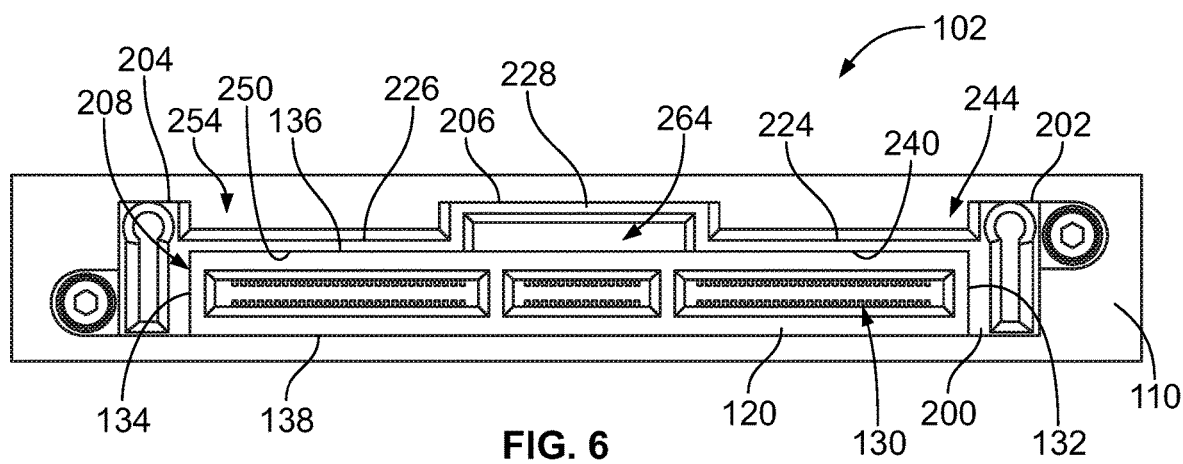
FIG. 6 is a top view of a portion of the card edge connector assembly showing the card edge connector and the support hardware.
Figure 7:
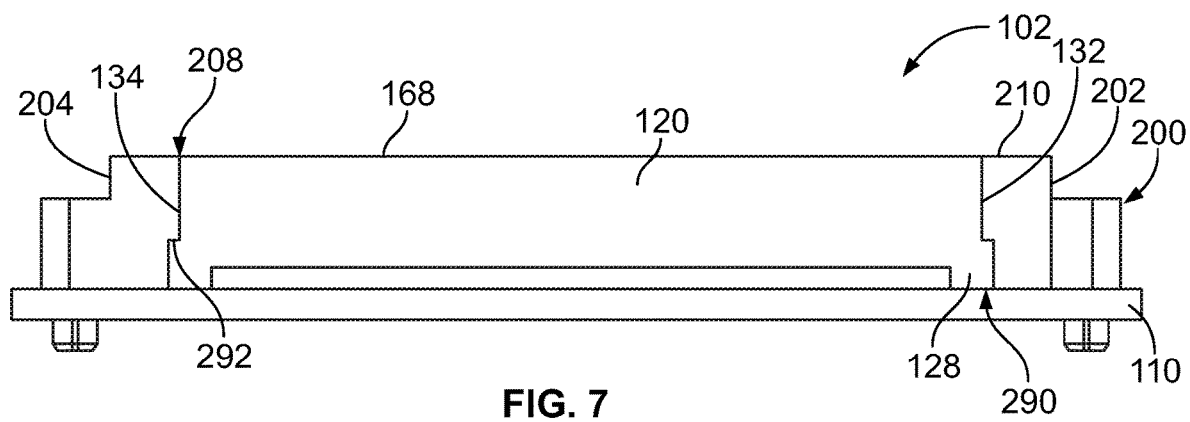
FIG. 7 is a rear view of a portion of the card edge connector assembly showing the card edge connector and the support hardware.
Figure 8:
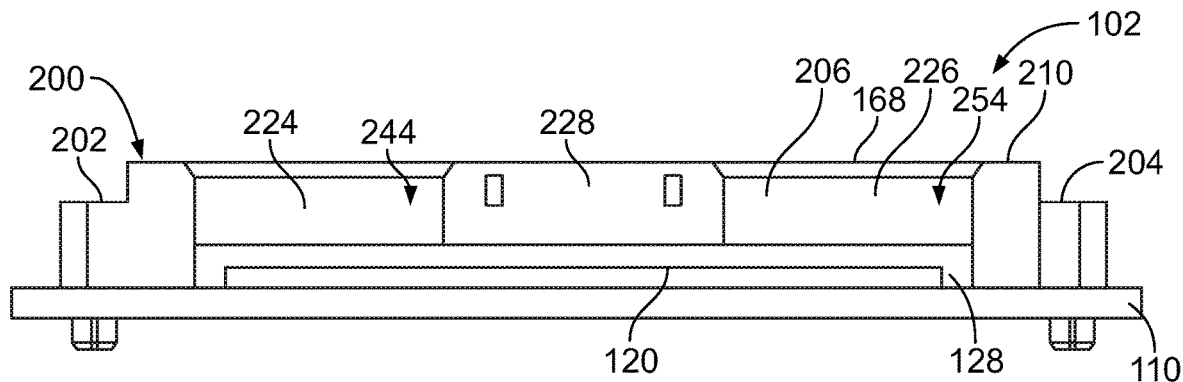
FIG. 8 is a front view of a portion of the card edge connector assembly showing the card edge connector and the support hardware.

FIG. 6 is a top view of a portion of the card edge connector assembly 102 showing the card edge connector 120 and the support hardware 200 mounted to the host circuit board 110. FIG. 7 is a rear view of a portion of the card edge connector assembly 102 showing the card edge connector 120 and the support hardware 200 mounted to the host circuit board 110. FIG. 8 is a front view of a portion of the card edge connector assembly 102 showing the card edge connector 120 and the support hardware 200 mounted to the host circuit board 110. The card edge connector 120 is received in the cavity 208 of the support hardware 200. In an exemplary embodiment, the top 210 of the support hardware 200 is flush with or below the top 168 of the card edge connector 120. As such, the support hardware 200 does not obstruct other components around the card edge connector 120. For example, the pluggable module 140 (shown in FIG. 2) is free to extend along and be on the card edge connector 120 without interference from the support hardware 200. For example, the mounting blocks 202, 204 to not interfere with the pluggable module 140 extending outward from the card slot 130 beyond the first end 132 or the second end 134.

The support hardware 200 is coupled to the host circuit board 110 such that the support hardware 200 at least partially surrounds the card edge connector 120. For example, the first mounting block 202 is provided at the first end 132 of the card edge connector 120, a second mounting block 204 is provided at the second end 134 of the card edge connector 120, and the side rail 206 is provided at the first side 136 of the card edge connector 120. As shown in FIG. 7, the notches 290 may receive the base 128 of the card edge connector 120 at the first and second ends 132, 134. The shoulders 292 may press downward on the base 128. As shown in FIG. 6, the side rail 206 may abut against the first side 136. For example, the interior surfaces 240, 250 of the first and second support beams 224, 226 may abut against of the first side 136. The third support beam 228 may be spaced apart from the first side 136 defining the third pocket 264 along the first side 136 that receives a portion of the pluggable module 140 (shown in FIG. 2). The third pocket 264 is an interior pocket that is open to the cavity 208. The first and second pockets 244, 254 are exterior pockets that are open to the exterior of the card edge connector assembly 102 for receiving portions of the pluggable module 140.

Figure 9:
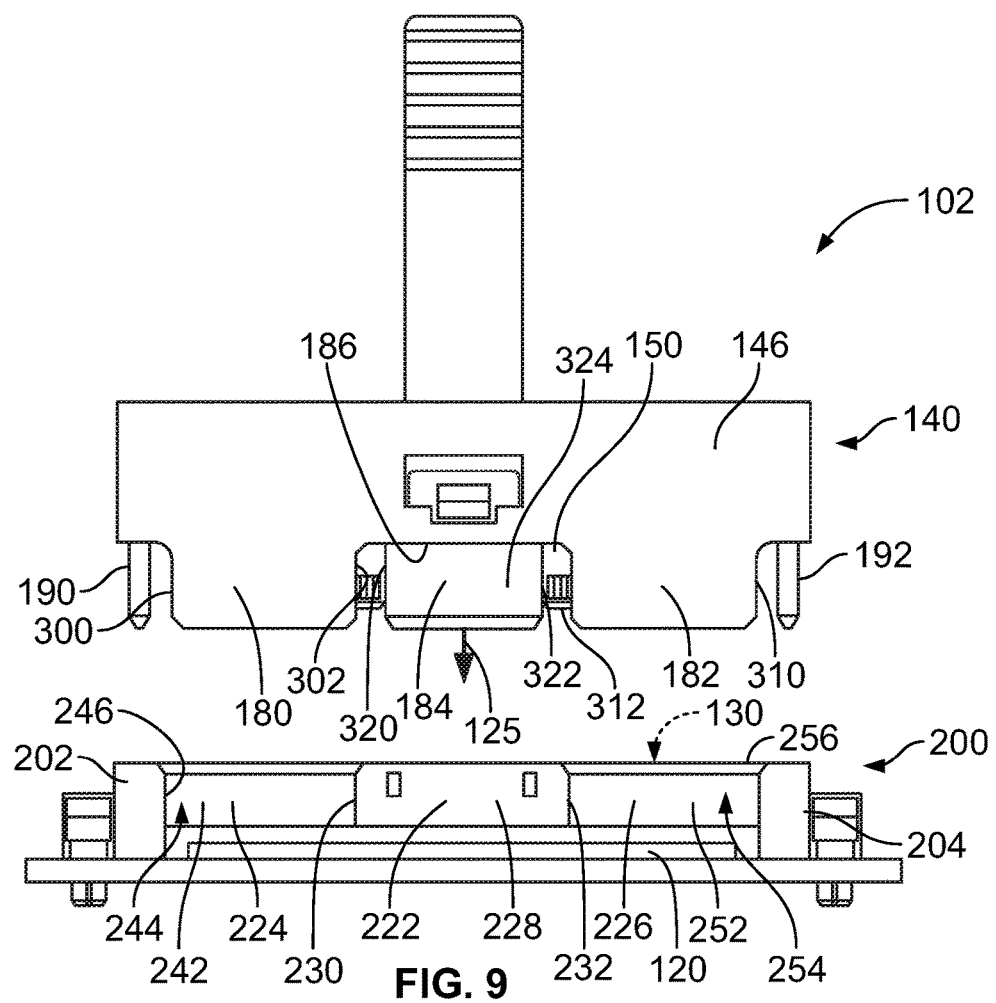
FIG. 9 is an exploded view of the card edge connector assembly in accordance with an exemplary embodiment showing a pluggable module poised for mating with the card edge connector and the support hardware.
Figure 10:
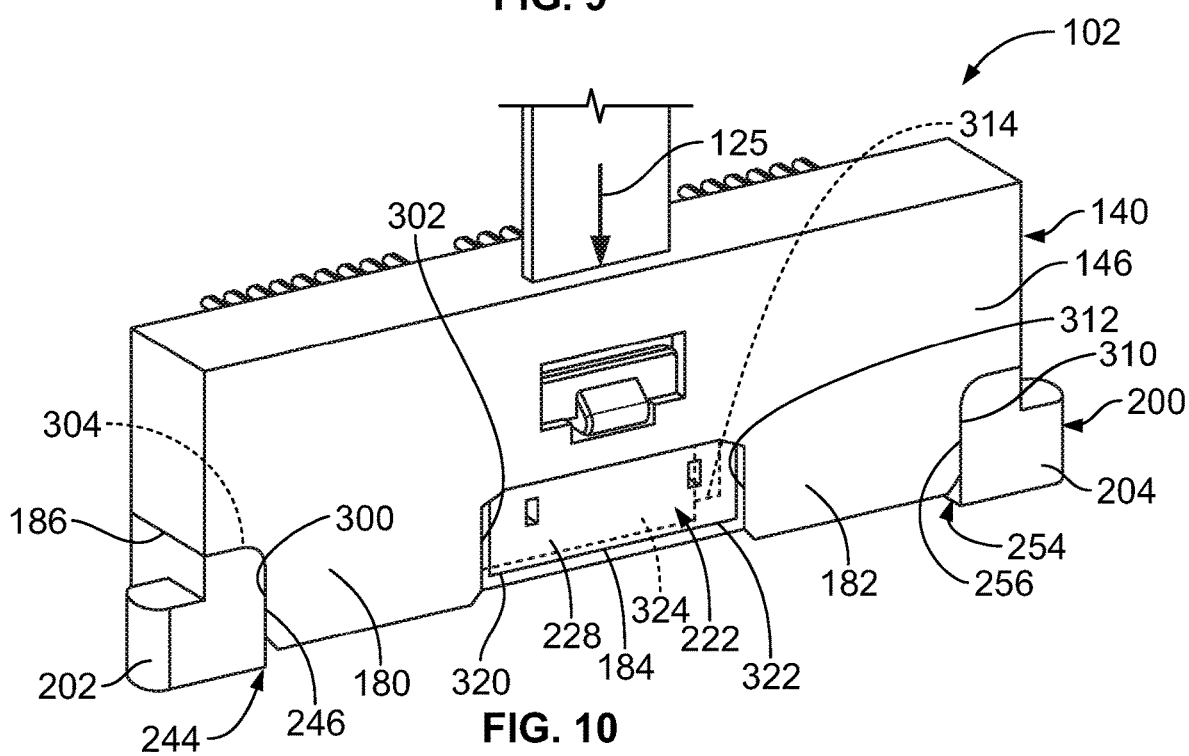
FIG. 10 is a front perspective view of the card edge connector assembly in accordance with an exemplary embodiment showing the pluggable module mated with the card edge connector and the support hardware.
Figure 11:
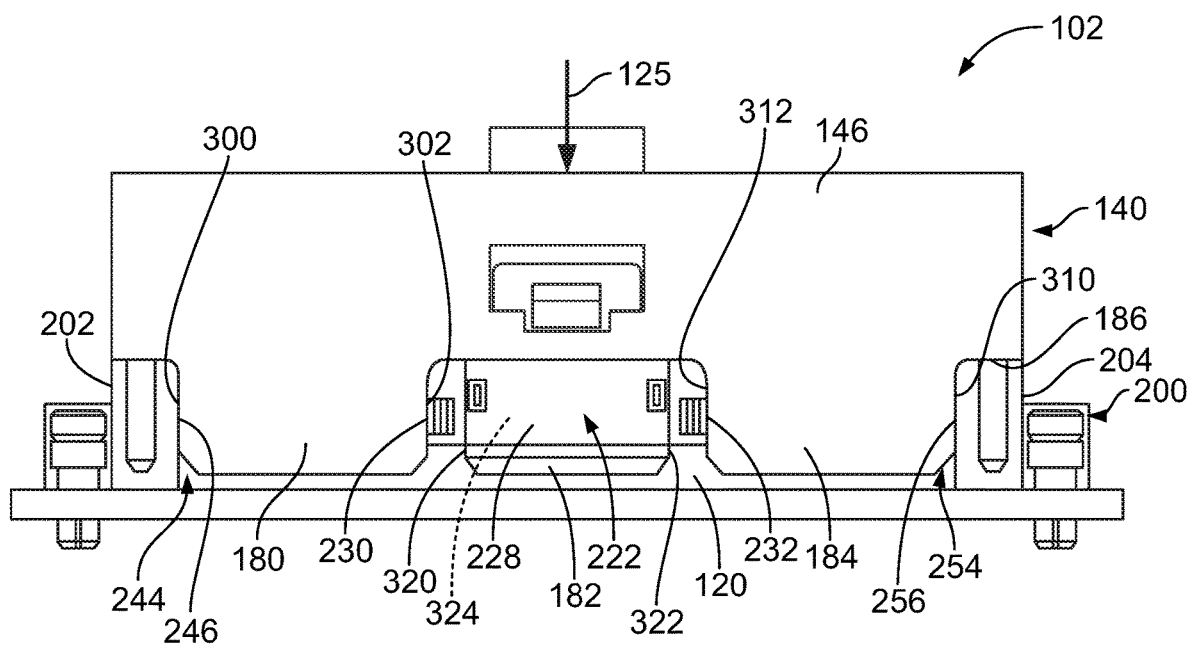
FIG. 11 is a front view of the card edge connector assembly in accordance with an exemplary embodiment showing the pluggable module mated with the card edge connector and the support hardware.

FIG. 9 is an exploded view of the card edge connector assembly 102 in accordance with an exemplary embodiment showing the pluggable module 140 poised for mating with the card edge connector 120 and the support hardware 200. FIG. 10 is a front perspective view of the card edge connector assembly 102 in accordance with an exemplary embodiment showing the pluggable module 140 mated with the card edge connector 120 and the support hardware 200. FIG. 11 is a front view of the card edge connector assembly 102 in accordance with an exemplary embodiment showing the pluggable module 140 mated with the card edge connector 120 and the support hardware 200.

During mating, the pluggable module 140 is aligned above the card edge connector 120 and the support hardware 200 and mated in the vertical mating direction 125. The guide tabs 190, 192 are used to guide mating with the support hardware 200. For example, the guide tabs 190, 192 may be loaded into the guide features 274 (shown in FIGS. 3 and 4). In an exemplary embodiment, the guide tabs 190, 192 extend below the mating edge of the circuit card 150 to orient and align the pluggable module 140 with the card slot 130 prior to loading the circuit card 150 in the card slot 130.

The supporting tabs 180, 182, 184 extend from the bottom 186 of the housing 146. In an exemplary embodiment, the supporting tabs 180, 182, 184 extend below the mating edge of the circuit card 150 to orient and align the pluggable module 140 with the card edge connector 120 prior to loading the circuit card 150 in the card slot 130. Optionally, bottom edges of the supporting tabs 180, 182, 184 may be coplanar with bottom edges of the guide tabs 190, 192. Alternatively, the guide tabs 190, 192 may be longer than the supporting tabs 180, 182, 184 to start alignment prior to the supporting tabs 180, 182, 180 for interfacing with the support hardware 200.

The supporting tabs 180, 182, 184 interface with the support hardware 200 to support the pluggable module 140 on the support hardware 200. For example, the first supporting tab 180 is received in the first pocket 244, the second supporting tab 182 is received in the second pocket 254 and the third supporting tab 184 is received in the third pocket 264. Surfaces and edges of the supporting tabs 180, 182, 184 engage complementary surfaces of the support hardware 200 to control side to side and end to end positioning of the pluggable module 140 relative to the support hardware 200. For example, the first supporting tab 180 includes support edges 300, 302 and a support surface 304; the second supporting tab 182 includes support edges 310, 312 and a support surface 314; and the third supporting tab 184 includes support edges 320, 322 and a support surface 324. The support edges 300, 302, 310, 312, 320, 322 may be vertical edges; however, may be at angles other than vertical angles in alternative embodiments. The support edge 300 is configured to engage the side surface 246 of the first mounting block 202. The support edge 310 is configured to engage the side surface 256 of the second mounting block 204. The support edges 302, 312 are configured to engage the first and second flanges 230, 232, respectively, of the step 222. The support edges 320, 322 are configured to engage the first and second flanges 230, 232, respectively, of the step 222. The support surfaces 304, 314 are interior surfaces of the supporting tabs 180, 182 that face the circuit card 150 and are configured to engage the exterior surfaces 242, 252 of the first and second support beams 224, 226, respectively. The support surface 324 is an exterior surface of the supporting tab 184 that faces away from the circuit card 150 and is configured to engage the interior surface 260 of the third support beam 228. The engagement between the supporting tabs 180, 182, 184 and the support hardware 200 may locate the pluggable module 140 with respect to the support hardware 200. The engagement between the supporting tabs 180, 182, 184 and the support hardware 200 may resist rotating of the pluggable module 140 out of the support hardware 200.

Figure 12:
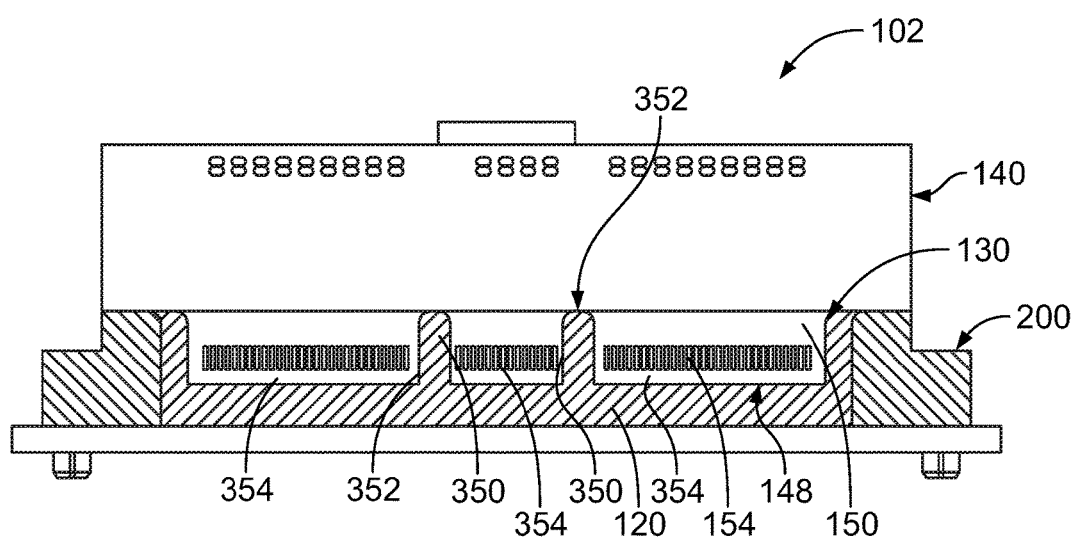
FIG. 12 is a partial sectional view of the card edge connector assembly in accordance with an exemplary embodiment showing the pluggable module mated with the card edge connector and the support hardware.

FIG. 12 is a partial sectional view of the card edge connector assembly 102 in accordance with an exemplary embodiment showing the pluggable module 140 mated with the card edge connector 120 and the support hardware 200. Portions of the card edge connector 120 and the support hardware 200 are removed to illustrate the circuit card 150 of the pluggable module 140 in the card slot 130 of the card edge connector 120.

The card edge connector 120 includes alignment tabs 350 in the card slot 130. The circuit card 150 includes alignment slots 352 that receive corresponding alignment tabs 350 to position the mating end 148 of the circuit card 150 in the card slot 130. The alignment tabs 350 align the contact pads 154 with the contacts 124 (shown in FIG. 2). The alignment slots 352 divide the mating end 148 of the circuit card 150 into card segments 354 received in corresponding portions of the card slot 130. The card segments 354 have edges 356 defining the card segments 354. The edges 356 are configured to engage the alignment tabs 350 to control an end to end position of the circuit card 150 in the card slot 130. The edges 356 may have a tighter tolerance than the other guide features of the pluggable module 140 and the support hardware 200, such as the supporting tabs 180, 182, 184.

Figure 13:
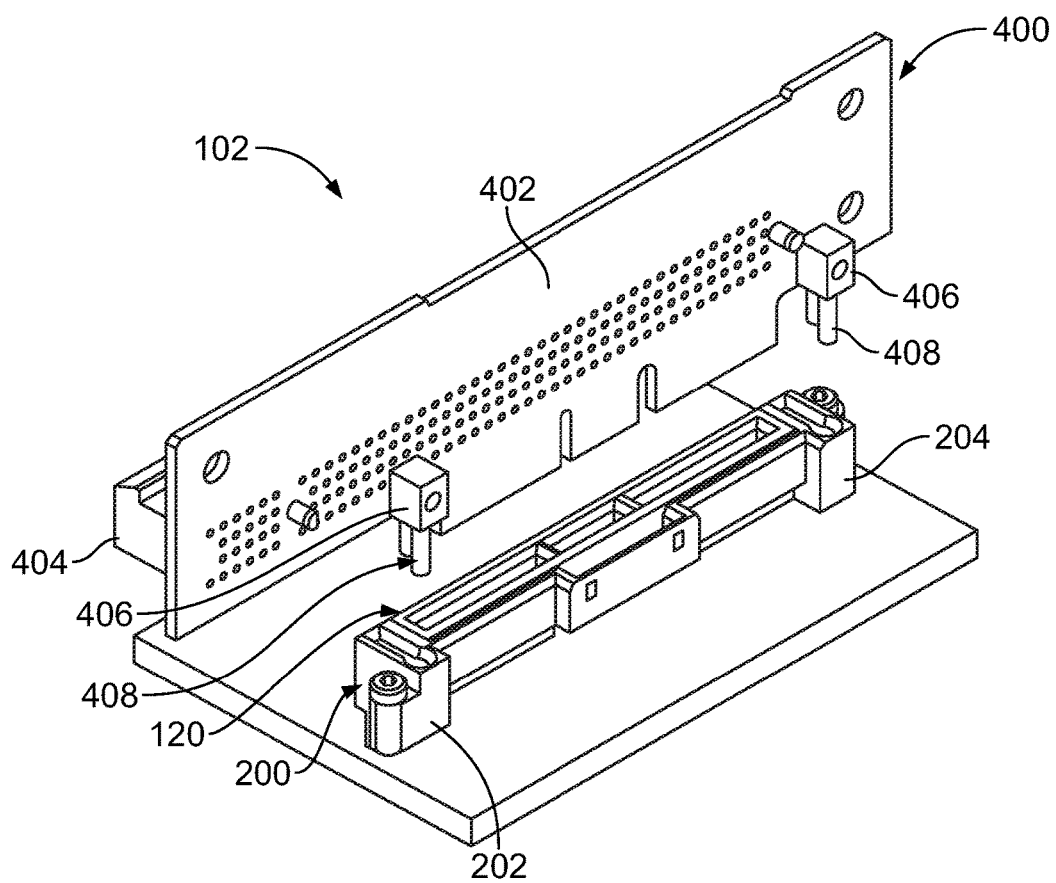
FIG. 13 is a front perspective view of the card edge connector assembly in accordance with an exemplary embodiment showing the card edge connector and the support hardware and illustrating a pluggable module in accordance with an exemplary embodiment.
Figure 14:
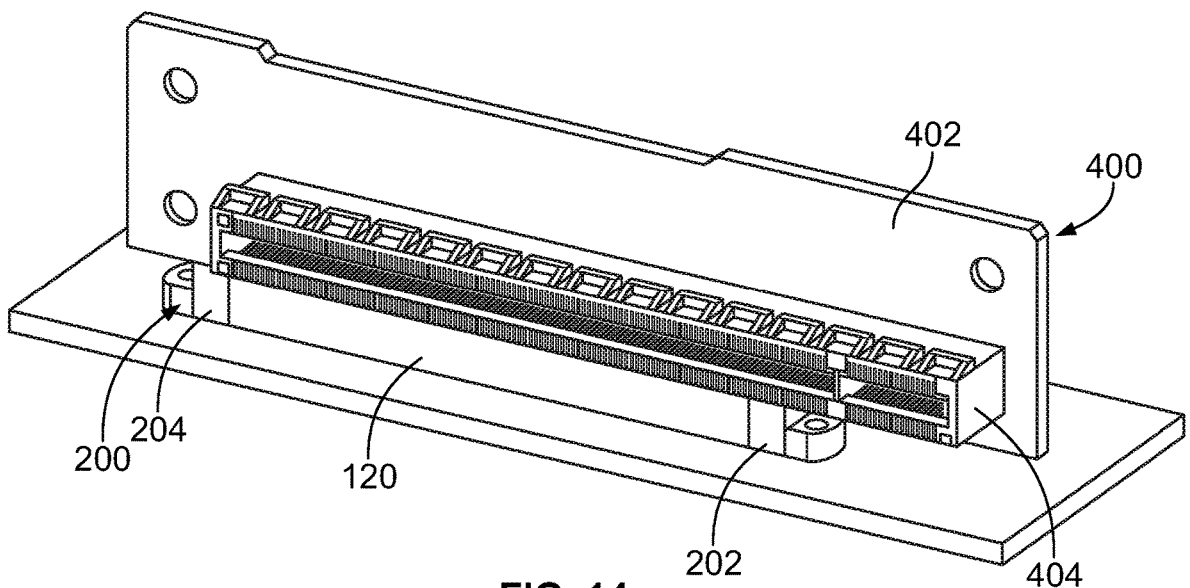
FIG. 14 is a rear perspective view of the card edge connector assembly in an exemplary embodiment showing the pluggable module coupled to the card edge connector and the support hardware.
Figure 15:
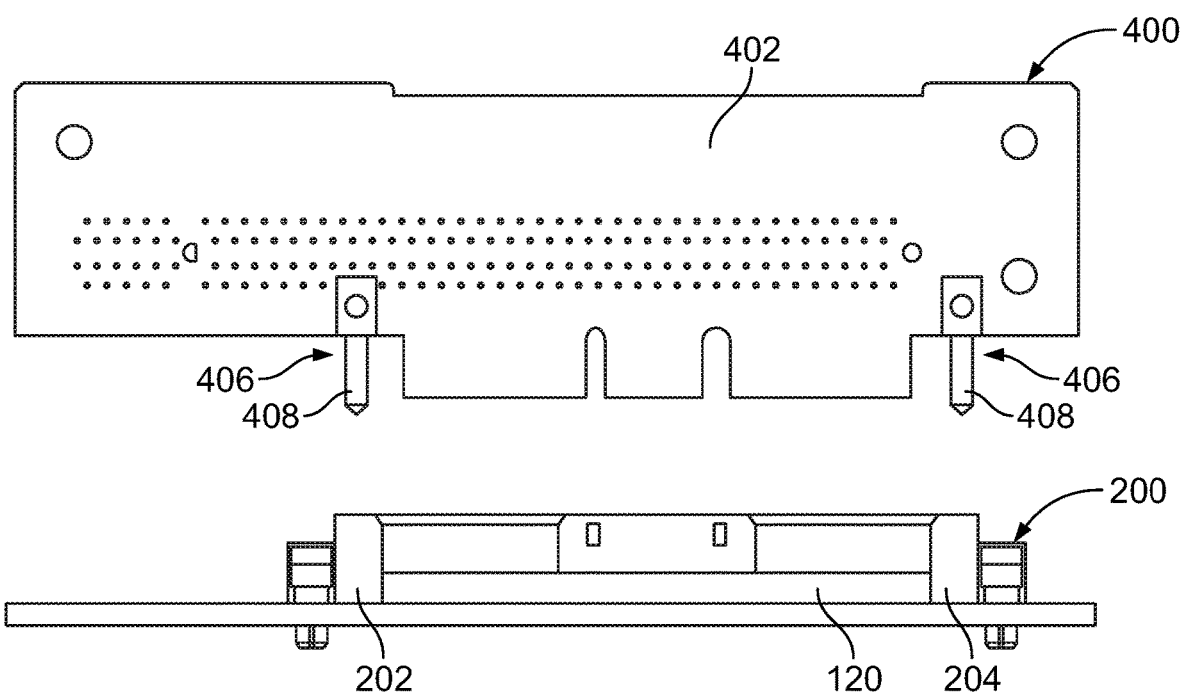
FIG. 15 is a front view of the card edge connector assembly in an exemplary embodiment showing the pluggable module poised for coupling to the card edge connector and the support hardware.
Figure 16:
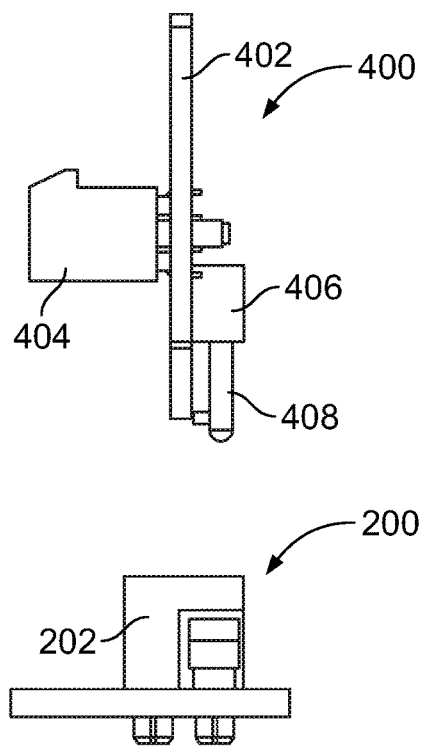
FIG. 16 is an end view of the card edge connector assembly and an exemplary embodiment showing the pluggable module poised for coupling to the card edge connector and the support hardware.

FIG. 13 is a front perspective view of the card edge connector assembly 102 in accordance with an exemplary embodiment showing the card edge connector 120 and the support hardware 200 and illustrating a pluggable module 400 in accordance with an exemplary embodiment. FIG. 14 is a rear perspective view of the card edge connector assembly 102 in an exemplary embodiment showing the pluggable module 400 coupled to the card edge connector 120 and the support hardware 200. FIG. 15 is a front view of the card edge connector assembly 102 in an exemplary embodiment showing the pluggable module 400 poised for coupling to the card edge connector 120 and the support hardware 200. FIG. 16 is an end view of the card edge connector assembly 102 and an exemplary embodiment showing the pluggable module 400 poised for coupling to the card edge connector 120 and the support hardware 200.

The pluggable module 400 is a riser card having a circuit card 402 and a riser connector 404 mounted to the circuit card 402. The pluggable module 400 includes mounting hardware 406 mounted to the circuit card 402 and/or the riser connector 404. The mounting hardware 406 is configured to be coupled to the support hardware 200 to support the pluggable module 400. The mounting hardware 406 includes guide tabs 408 configured to be received in the mounting blocks 202, 204 of the support hardware 200. The mounting hardware 406 may guide mating with the support hardware 200. The mounting hardware 200 may alleviate stress on the card edge connector 120 from side to side movement, end to end movement or rotational movement of the pluggable module 400 relative to the support hardware 200. The pluggable module 400 may include a housing or other component surrounding the circuit card 402 and/or the riser connector 404 and/or the mounting hardware 406.

Figure 17:
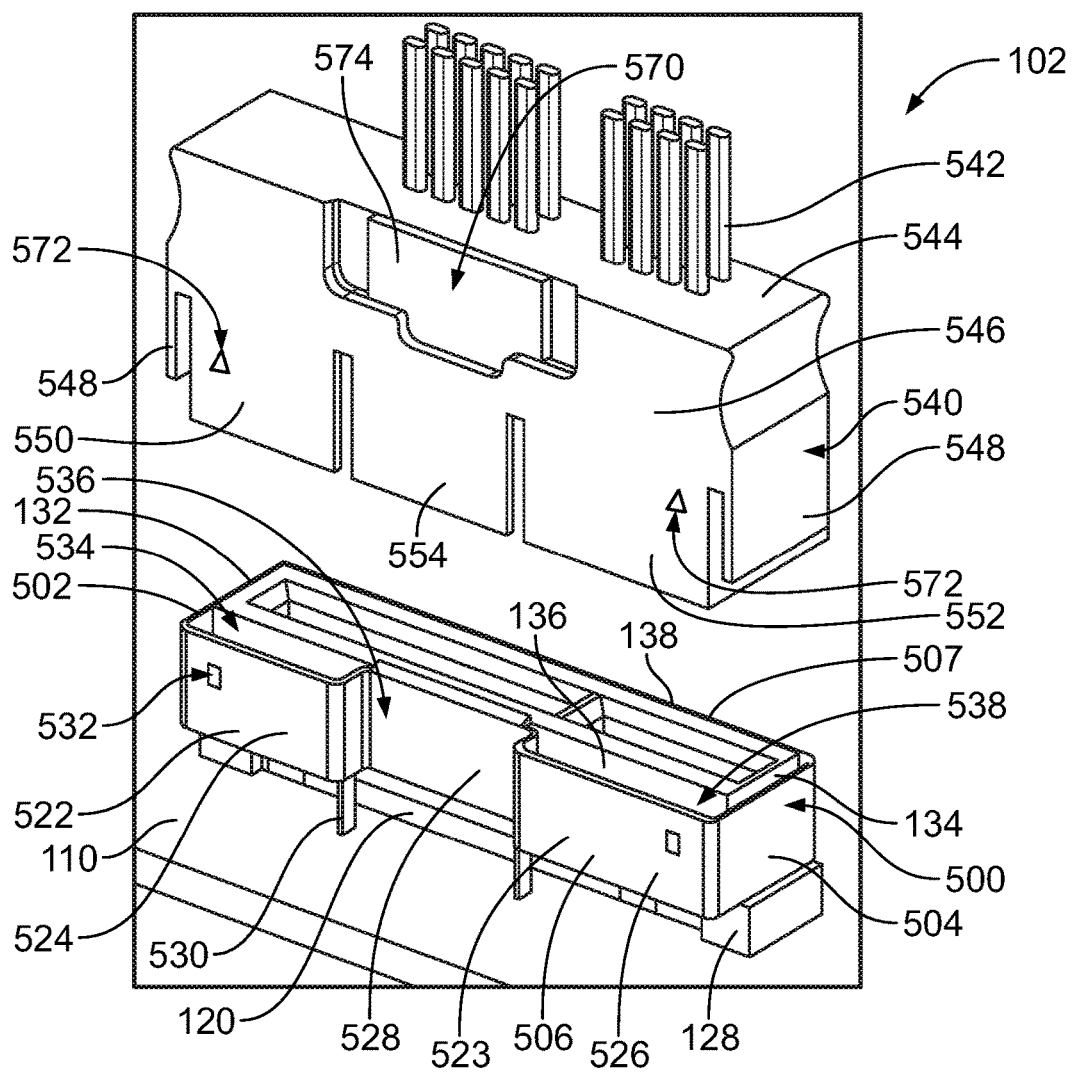
FIG. 17 is a perspective view of the card edge connector assembly in accordance with an exemplary embodiment.

FIG. 17 is a perspective view of the card edge connector assembly 102 in accordance with an exemplary embodiment. The card edge connector assembly 102 includes the card edge connector 120, support hardware 500 and the pluggable module 540 configured to be mated with the card edge connector 120 and the support hardware 500. The support hardware 500 is similar to the support hardware 200 however, the support hardware 500 is sized and shaped differently. The pluggable module 540 is similar to the pluggable module 120; however, the pluggable module 540 is sized and shaped differently for mating with the support hardware 500.

In the illustrated embodiment, the support hardware 500 is stamped and formed and extends around the entire perimeter of the card edge connector 120. The top of the support hardware 500 is flush with or below the top of the card edge connector 120. The support hardware 500 includes mounting blocks 502, 504 at the first and second ends 132, 134 of the card edge connector 120. The mounting blocks 502, 504 configured to be mounted to the base 128 of the card edge connector 120. The mounting blocks 502, 504 may extend through the base 128 for mounting to the host circuit board 110. The support hardware 500 includes a first side rail 506 and a second side rail 507 extending along the first and second sides 136, 138 of the card edge connector 120. In the illustrated embodiment, the first side rail 506 includes a plurality of pockets for receiving corresponding portions of the pluggable module 540, such as supporting tabs of the pluggable module 540, while the second side rail 507 extend flush with the second side 138 of the card edge connector 120. However, the second side rail 507 may additionally or alternatively include pockets. In the illustrated embodiment, the first side rail 506 includes two internal pockets and a single external pocket.

The first side rail 506 includes a first step 522 and a second step 523. The first side rail 506 includes a first support beam 524, a second support beam 526 and a third support beam 528. The first support beam 524 extends along the first step 522. The second support beam 526 extends along the second step 523. The third support beam 528 extends between the first and second steps 522, 523. Other arrangements are possible in alternative embodiments. In an exemplary embodiment, the support hardware 500 includes support arms 530 extending between the steps 522, 523 and the host circuit board 110. In an exemplary embodiment, the support hardware 500 includes latching features 532 along the first support beam 524 and the second support beam 526. The first support beam 524 includes a first pocket 534. The second support beam 526 includes a second pocket 536. The third support beam 528 includes a third pocket 538. The first and second pockets 534, 536 are internal pockets. The third pocket 538 is an external pocket.

The pluggable module 540 includes cables 542 extending from a top 544 of a housing 546. The pluggable module 540 includes guide tabs 548 at the opposite ends of the housing 546. The guide tabs 548 are configured to interface with the mounting blocks 502, 504 to orient the pluggable module 540 relative to the support hardware 500. The pluggable module 540 includes supporting tabs 550, 552, 554 at the bottom of the housing 546. The supporting tabs 550, 552, 554 are configured to be received in corresponding pockets 534, 536, 538. The supporting tabs 550, 552, 554 may guide mating of the pluggable module 540 with the support hardware 500. The supporting tabs 550, 552, 554 may control side to side and end to end positioning of the pluggable module 540 relative to the card edge connector 120 and the support hardware 500. The supporting tabs 550, 552, 554 may control an angular orientation of the pluggable module 540 with respect to the support hardware 500 by resisting rotation during mating and on mating and by controlling mating and unmating in a vertical direction.

The pluggable module 540 includes a latch 570 having latching fingers 572 configured to engage the latching features 532 of the support hardware 500. The latch 570 includes an actuator 574 for unlatching the latching fingers 572. In the illustrated embodiment, the actuator 574 is a push button; however, other types of actuators may be provided in alternative embodiments.

Figure 18:
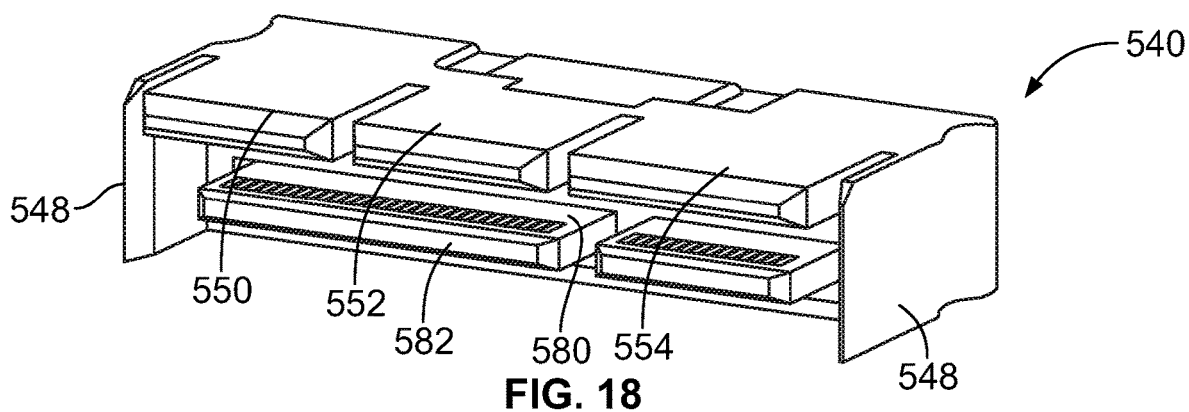
FIG. 18 is a bottom view of a pluggable module in accordance with an exemplary embodiment.

FIG. 18 is a bottom view of the pluggable module 540 in accordance with an exemplary embodiment. The pluggable module 540 includes a circuit card 580 having a card edge at a mating end 582 of the circuit card 580. the guide tabs 548 extend along the circuit card 580. The supporting tabs 550, 552, 554 extend along the circuit card 580 and may extend below the circuit card 580 to guide mating of the pluggable module 540 with the support hardware 500 and the card edge connector 120 prior to the circuit card 580 being loaded into the card edge connector 120.

Figure 19:
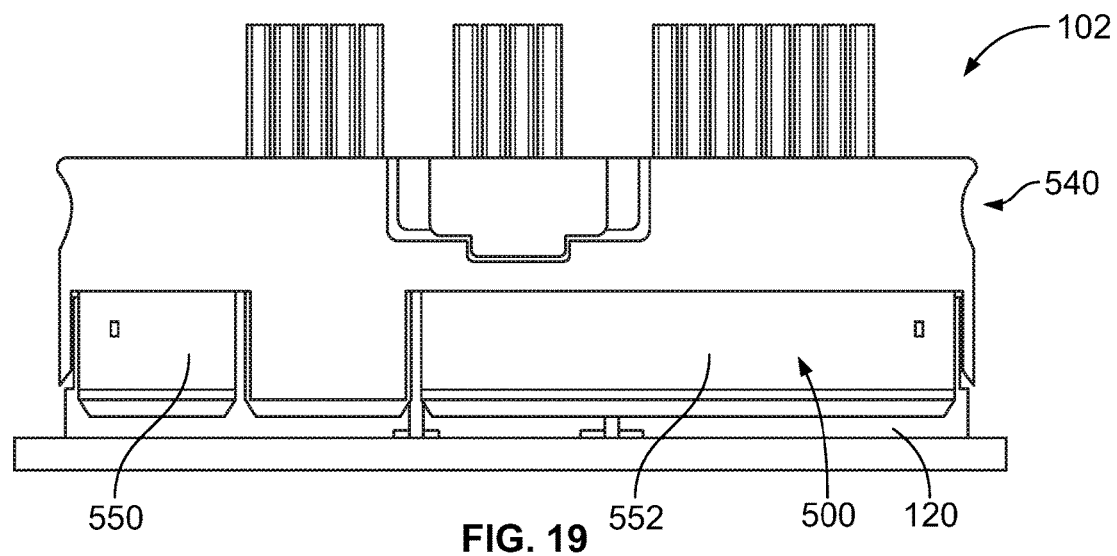
FIG. 19 is a front view of the card edge connector assembly showing the pluggable module mated to the support hardware and the card edge connector.

FIG. 19 is a front view of the card edge connector assembly 102 showing the pluggable module 540 mated to the support hardware 500 and the card edge connector 120. In the illustrated embodiment, the second supporting tab 552 is longer than the first supporting tabs 550. For example, the overall length of the pluggable module 540 may be wider in the embodiment shown in FIG. 19 in the embodiment shown in FIG. 18. For example, a wider circuit card may be provided having a greater number of contact pads. Any of the supporting tabs 550, 552, 554 may have any length including equal lengths or unequal lengths.

Figure 20:
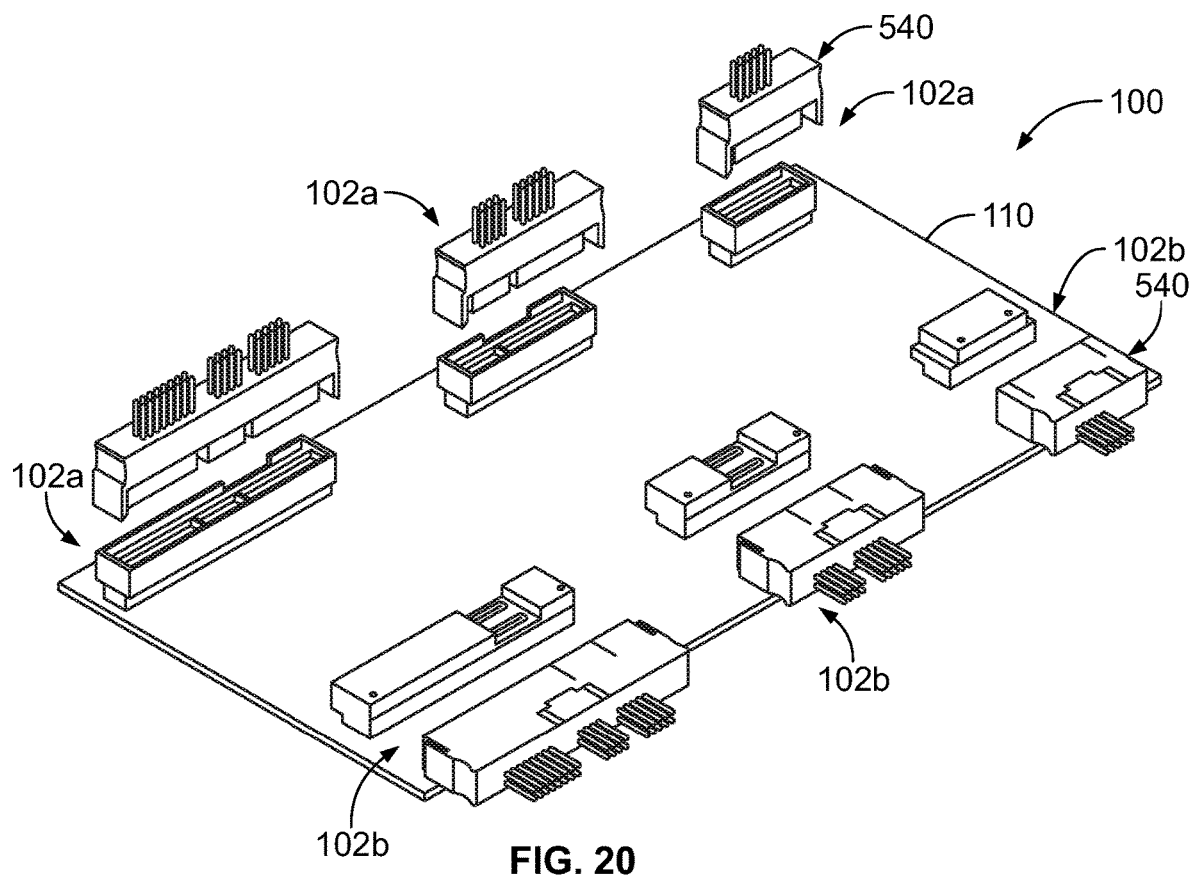
FIG. 20 illustrates the electrical system in accordance with an exemplary embodiment showing a plurality of different sized card edge connector assemblies.

FIG. 20 illustrates the electrical system 100 in accordance with an exemplary embodiment showing a plurality of different sized card edge connector assemblies 102 and showing a plurality of vertical card edge connector assemblies 102a and a plurality of right angle card edge connector assemblies 102b. Optionally, the same pluggable modules 540 may be configured to be coupled to the vertical card edge connector assemblies 102a and to the right angle card edge connector assemblies 102b. Alternatively, the pluggable modules 540 may have different features for mating to the vertical card edge connector assemblies 102a and the right angle card edge connector assemblies 102b. The right angle card edge connector assemblies 102b may be similar to the vertical card edge connector assemblies 102a; however, the card edge connector 120b and the support hardware 500b may be shaped differently for mounting to the host circuit board 110 and for right angle mating as opposed to vertical mating. In an exemplary embodiment, widths and amounts of the pockets and corresponding supporting tabs may vary depending on the overall widths of the card edge connector assemblies 102. For example, narrow card edge connector assemblies 102 may include a single pocket and supporting tab whereas wider card edge connector assemblies 102 may include multiple pockets and supporting tabs.

Figure 21:
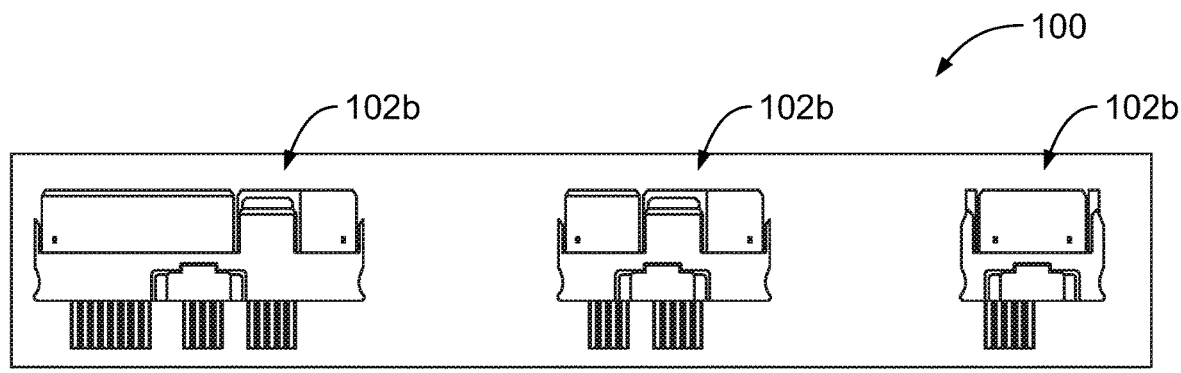
FIG. 21 is a top view of a portion of the electrical system showing a plurality of card edge connector assemblies in accordance with an exemplary embodiment.
Figure 22:
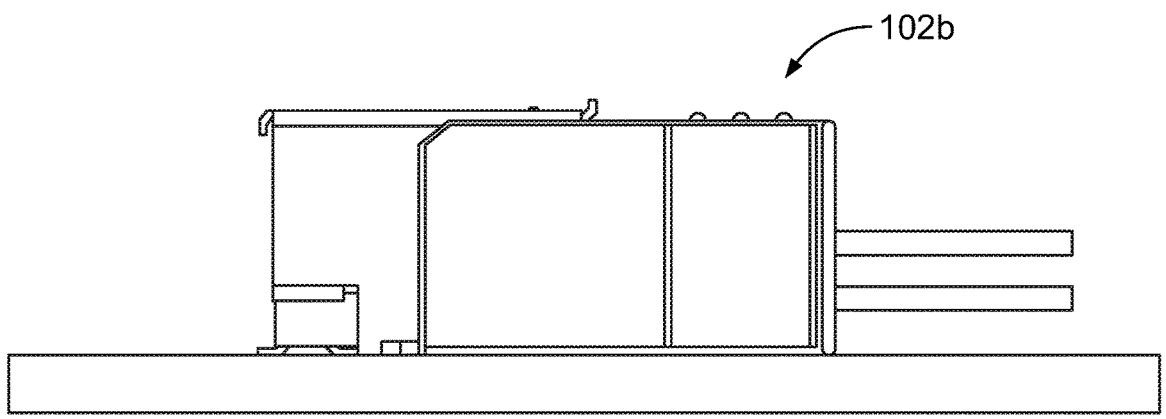
FIG. 22 is an end view of the card edge connector assembly in accordance with an exemplary embodiment.

FIG. 21 is a top view of a portion of the electrical system 100 showing a plurality of right angle card edge connector assemblies 102b. FIG. 22 is an end view of one of the right angle card edge connector assemblies 102b in accordance with an exemplary embodiment.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A card edge connector assembly comprising:
   a card edge connector having a housing extending between a top and a bottom configured to be mounted to a host circuit board, the card edge connector having a card slot at the top configured to receive a pluggable module in a mating direction, the housing holding contacts in the card slot to electrically connect to the pluggable module, the contacts being configured to be electrically connected to the host circuit board; and
   support hardware having a top and a bottom, the support hardware having a first mounting block at a first end and a second mounting block at a second end, the support hardware having a side rail extending between the first and second mounting blocks, the support hardware having a cavity defined on a first side by the side rail and on the first and second ends by the first and second mounting blocks, the cavity receiving the card edge connector, the side rail having a pocket configured to receive a support tab of the pluggable module to position the pluggable module relative to the support hardware;
   wherein the top of the support hardware is flush with or below the top of the card edge connector.

2. The card edge connector assembly of claim 1, wherein the side rail is provided at the top of the support hardware.

3. The card edge connector assembly of claim 1, wherein the support hardware includes guide features at the first and second mounting blocks to guide mating with the pluggable module.

4. The card edge connector assembly of claim 1, wherein the support hardware includes a keying feature to orient mating with the pluggable module.

5. The card edge connector assembly of claim 1, wherein the side rail includes a support beam defining the pocket, the pocket open to the cavity.

6. The card edge connector assembly of claim 5, wherein the support beam includes a latching feature configured to latchably interact with a complementary latching feature of the pluggable module to securely couple the pluggable module to the card edge connector.

7. The card edge connector assembly of claim 1, wherein the pocket of the support hardware includes an interior pocket open to the cavity and the support hardware includes an exterior pocket open to an exterior of the card edge connector assembly, the exterior pocket is configured to receive a supporting tab of the pluggable module to position the pluggable module relative to the support hardware.

8. The card edge connector assembly of claim 1, wherein the side rail comprises a step, a first support beam between the first mounting block and the step and a second support beam between the second mounting block and the step, the first support beam having an exterior surface, the pocket defining a first pocket at the exterior surface between the first mounting block and the step configured to receive the supporting tab of the pluggable module, the second support beam having an exterior surface defining a second pocket between the second mounting block and the step configured to receive a supporting tab of the pluggable module.

9. The card edge connector assembly of claim 8, wherein the step comprises a third support beam having an interior surface defining a third pocket open to the cavity, the third pocket being configured to receive a supporting tab of the pluggable module to position the pluggable module relative to the support hardware.

10. The card edge connector assembly of claim 1, wherein the first mounting block comprises an anchor opening receiving a first anchor for securing the support hardware to the host circuit board independent of the card edge connector and the second mounting block comprises an anchor opening receiving a second anchor for securing the support hardware to the host circuit board independent of the card edge connector.

11. The card edge connector assembly of claim 10, wherein the anchor includes a spreading feature configured to expand outward after mounting to the host circuit board to secure the support hardware to the host circuit board.

12. The card edge connector assembly of claim 1, wherein the housing of the card edge connector includes a base at the bottom configured to be mounted to the host circuit board, the first mounting block including a shoulder receiving a first end of the base, the second mounting block including a shoulder receiving a second end of the base, the shoulders pressing downward against the first and second ends of the base to support the card edge connector.

13. The card edge connector assembly of claim 1, wherein the support hardware includes a guide feature configured to engage and orient the pluggable module prior to the pluggable module plugging into the card slot of the card edge connector.

14. The card edge connector assembly of claim 13, wherein the guide feature extends parallel to the mating direction to provide angular alignment with the mating direction of the pluggable module relative to the support hardware.

15. A card edge connector assembly comprising:
a card edge connector having a housing extending between a top and a bottom configured to be mounted to a host circuit board, the housing having a first end and a second end, the housing having a first side and a second side extending between the first and second ends, the card edge connector having a card slot at the top configured to receive a pluggable module in a mating direction, the housing holding contacts in the card slot to electrically connect to the pluggable module, the contacts being configured to be electrically connected to the host circuit board; and
support hardware having a top and a bottom, the support hardware having a first mounting block at a first end and a second mounting block at a second end, the first and second mounting blocks configured to be mounted to the host circuit board, the support hardware having a side rail extending between the first and second mounting blocks, the support hardware having a cavity defined on a first side by the side rail and on the first and second ends by the first and second mounting blocks, the cavity receiving the card edge connector, the side rail having a step defining a pocket open to the cavity, a first support beam between the first mounting block and the step and a second support beam between the second mounting block and the step, the step having a third support beam, the first support beam having an interior surface abutting against the first side of the housing of the card edge connector and an exterior surface configured to engage a first supporting tab of the pluggable module to position the pluggable module relative to the support hardware, the second support beam having an interior surface abutting against the first side of the housing of the card edge connector and an exterior surface configured to engage a second supporting tab of the pluggable module to position the pluggable module relative to the support hardware, the third support beam having an interior surface facing the pocket and configured to engage a third supporting tab of the pluggable module to position the pluggable module relative to the support hardware.

16. The card edge connector assembly of claim 15, wherein the support hardware includes guide features at the first and second mounting blocks to guide mating with the pluggable module.

17. The card edge connector assembly of claim 15, wherein the third support beam includes a latching feature configured to latchably interact with a complementary latching feature of the pluggable module to securely couple the pluggable module to the card edge connector.

18. The card edge connector assembly of claim 15, wherein the first mounting block comprises an anchor opening receiving a first anchor for securing the support hardware to the host circuit board independent of the card edge connector and the second mounting block comprises an anchor opening receiving a second anchor for securing the support hardware to the host circuit board independent of the card edge connector.

19. The card edge connector assembly of claim 15, wherein the housing of the card edge connector includes a base at the bottom configured to be mounted to the host circuit board, the first mounting block including a shoulder receiving a first end of the base, the second mounting block including a shoulder receiving a second end of the base, the shoulders pressing downward against the first and second ends of the base to support the card edge connector.

20. A card edge connector assembly comprising:

a pluggable module including a circuit card having a mating end including contact pads, the pluggable module including a housing holding the circuit card, the housing having a bottom and including a first supporting tab extending from the bottom, a second supporting tab extending from the bottom and a third supporting tab extending from the bottom;

a card edge connector receiving the pluggable module, the card edge connector having a housing extending between a top and a bottom configured to be mounted to a host circuit board, the housing having a first end and a second end, the housing having a first side and a second side extending between the first and second ends, the card edge connector having a card slot at the top receiving the mating end of the pluggable module in a mating direction, the housing holding contacts in the card slot to electrically connect to corresponding contact pads of the pluggable module, the contacts being configured to be electrically connected to the host circuit board; and support hardware having a top and a bottom, the support hardware having a first mounting block at a first end and a second mounting block at a second end, the first and second mounting blocks configured to be mounted to the host circuit board, the support hardware having a side rail extending between the first and second mounting blocks, the support hardware having a cavity defined on a first side by the side rail and on the first and second ends by the first and second mounting blocks, the cavity receiving the card edge connector, the side rail having a step, a first support beam between the first mounting block and the step and a second support beam between the second mounting block and the step, the step having a third support beam, the first support beam having an interior surface and an exterior surface, the second support beam having an interior surface and an exterior surface, the third support beam having an interior surface and an exterior surface, the interior surface of the first support beam abutting against the first side of the housing of the card edge connector and the exterior surface of the first support beam defining a first pocket receiving the first supporting tab, the interior surface of the second support beam abutting against the first side of the housing of the card edge connector and the exterior surface of the second support beam defining a second pocket receiving the second supporting tab, the step defining a third pocket and the interior surface of the third support beam facing the third pocket and engaging the third supporting tab of the pluggable module.

* * * * *